United States Patent [19]
Wang et al.

[11] Patent Number: 6,046,465
[45] Date of Patent: Apr. 4, 2000

[54] BURIED REFLECTORS FOR LIGHT EMITTERS IN EPITAXIAL MATERIAL AND METHOD FOR PRODUCING SAME

[75] Inventors: Shih-Yuan Wang, Palo Alto; Yong Chen, Mountain View; Scott W. Corzine, Sunnyvale; R. Scott Kern, San Jose; Carrie C. Coman, Milpitas; Michael R. Krames, Mountain View; Frederick A. Kish, Jr., San Jose, all of Calif.; Yawara Kaneko, Kanagawa, Japan

[73] Assignee: Hewlett-Packard Company, Palo Alto, Calif.

[21] Appl. No.: 09/062,368

[22] Filed: Apr. 17, 1998

[51] Int. Cl.[7] .............................. C30B 19/00; H01L 33/00
[52] U.S. Cl. ................................ 257/98; 117/84; 117/95; 117/104; 117/106; 257/94
[58] Field of Search ................................ 428/620; 257/13, 257/79, 84, 85, 94, 95, 98; 117/9, 54, 58, 84, 95, 104, 106, 108

[56] References Cited

U.S. PATENT DOCUMENTS

| | | | |
|---|---|---|---|
| 4,522,662 | 6/1985 | Bradbury et al. | 117/90 |
| 4,990,970 | 2/1991 | Fuller | 257/98 |
| 5,828,088 | 10/1998 | Mauk | 257/98 |
| 5,834,325 | 11/1998 | Motoki et al. | 438/22 |

*Primary Examiner*—Benjamin Utech
*Assistant Examiner*—Donald L. Champagne

[57] ABSTRACT

A buried reflector 50 in an epitaxial lateral growth layer forms a part of a light emitting device and allows for the fabrication of a semiconductor material that is substantially low in dislocation density. The laterally grown material is low in dislocation defect density where it is grown over the buried reflector making it suitable for high quality optical light emitting devices, and the embedded reflector eliminates the need for developing an additional reflector.

8 Claims, 6 Drawing Sheets

BURIED REFLECTORS FOR LIGHT EMITTERS IN EPITAXIAL MATERIAL AND METHOD FOR PRODUCING SAME

FIELD OF THE INVENTION

The present invention relates generally to the fabrication of semiconductor materials, and, more particularly, to an optical reflector buried within an epitaxial laterally-grown material and a method for producing same.

BACKGROUND OF THE INVENTION

Light emitting diodes (LED's), lasers, and the like (collectively known as light emitting devices) are used widely in many applications today such as communications systems, medical systems, and display systems. These light emitting devices are commonly fabricated with epitaxial materials formed on a substrate, the epitaxial materials having a p-n junction, or active region, formed therein and include at least one Bragg reflector. A Bragg reflector is a fundamental building block of many light emitting devices. Typically, in LED's, a Bragg reflector is fabricated between an active region and a substrate, and in lasers, a Bragg reflector is fabricated on either side of an active region. In the case of an LED, light emitted from an active region toward the substrate is reflected by a Bragg reflector back toward the surface where it combines with the light going toward the surface, thus increasing the light output of the LED. Bragg reflectors are typically composed of alternating layers of material having different refractive indices.

LED's and lasers are typically fabricated by growing semiconductor layers on a substrate material. The portions of the semiconductor layers that reside within the optical and electrical path of the device should be relatively defect free.

An active region is typically formed from epitaxial growth material, which can be grown over a mask to form reduced defect growth material. The semiconductor material is typically fabricated by growing an epitaxial layer of a chosen material over an oxide layer upon a substrate material. The substrate material may be, and frequently is, of a different composition than the material used to grow the epitaxial layer.

The epitaxial layer is typically a thin single crystalline film that is deposited upon a crystalline substrate. The epitaxial layer is typically deposited so that the crystal lattice structure of the epitaxial layer closely matches the crystal lattice structure of the substrate. When there is a significant mismatch between the lattice structure of the substrate and the epitaxial layer, a large number of defects, or dislocations, can result. Dislocations manifest in the form of imperfections in the crystal structure and can result in high optical loss, low optical efficiency, non uniform quantum wells in the active region, or the reduction of the electrical quality of the material, thus preventing the material from being used to fabricate certain devices, such as lasers and transistor structures. A largely dislocation-free material is desired for these highly critical devices.

Generating blue light is an important application of many of the LED's and lasers discussed herein. Blue light devices are generally based upon gallium nitride (GaN) materials, however, it is difficult to grow relatively defect free gallium nitride material.

Dislocation density can be reduced by growing an epitaxial lateral growth layer of gallium nitride material over a mask layer. When the epitaxial layer is then grown over the mask, the epitaxial layer grows laterally, resulting in a reduced dislocation density being present in the portion of the epitaxial layer that resides over the mask. Because the dislocations tend to propagate vertically, the vertically grown material present in the unmasked region of a wafer will be of higher dislocation density as the defects will continue to propagate throughout the layer.

Thus, an unaddressed need exists in the industry for a simplified method for growing a relatively defect free semiconductor material for a light emitting device that includes a reflector, or mirror, therein.

SUMMARY OF THE INVENTION

The invention provides a buried reflector upon which epitaxial material is laterally grown and a method for producing same. Although not limited to these particular applications, the material and method for producing the buried reflector having the low dislocation density material grown laterally thereon are particularly suited for fabrication of high quality GaN material system epitaxial layers over a sapphire substrate, which in turn are used to develop high quality light emitting devices, such as light emitting diodes (LED's) and lasers, particularly surface emitting lasers.

The GaN material system can include members of the Group III-V family including, but not limited to, gallium nitride (GaN), indium gallium nitride (InGaN), indium nitride (InN), aluminum gallium nitride (AlGaN), aluminum nitride (AlN), aluminum indium gallium nitride (AlInGaN), gallium arsenide nitride (GaAsN), indium gallium arsenide nitride (InGaAsN), aluminum gallium arsenide nitride (AlGaAsN), gallium phosphide nitride (GaPN), indium gallium phosphide nitride (InGaPN), aluminum gallium phosphide nitride (AlGaPN), etc.

The present invention can be conceptualized as providing a method for forming a buried reflector in a material system comprising the following steps. A first material having a first refractive index is applied over a substrate. Then, a second material having a second refractive index is applied over the first material, the first and second material layers forming a reflector. Finally, an epitaxial lateral growth layer is grown over the reflector. The portion of epitaxial lateral growth that covers the reflector has substantially fewer defects than the portion of epitaxial lateral growth that extends over the substrate. Additionally, an active region may be included in the epitaxial lateral growth layer.

In architecture, when employed in connection with the fabrication of a buried reflector in a material system, the aforementioned method for forming a buried reflector in a material system results in a low dislocation density material over the buried reflector as follows. A material system comprises a substrate and a reflective layer over the substrate. An epitaxial lateral growth layer extends over the reflective layer and onto the substrate. An active region may be included in the epitaxial lateral growth layer.

The invention has numerous advantages, a few of which are delineated, hereafter, as merely examples.

An advantage of the invention is that it increases the light output of a light emitting device.

Another advantage of the invention is that it eliminates the step of adding an additional reflector in a light emitting device.

Another advantage of the invention is that it allows the growth of low dislocation defect material over a buried reflector.

Another advantage of the invention is that it improves the electrical performance of the material forming the epitaxial layer of a semiconductor.

Another advantage of the invention is that it can be used to provide current confinement.

Another advantage of the invention is that it is simple in design and easily implemented on a mass scale for commercial production.

Other features and advantages of the invention will become apparent to one with skill in the art upon examination of the following drawings and detailed description. These additional features and advantages are intended to be included herein within the scope of the present invention.

BRIEF DESCRIPTION OF THE DRAWINGS

The present invention, as defined in the claims, can be better understood with reference to the following drawings. The components within the drawings are not necessarily to scale relative to each other, emphasis instead being placed upon clearly illustrating the principles of the present invention.

DETAILED DESCRIPTION OF THE PREFERRED EMBODIMENT

The present invention can be implemented using a variety of substrate and epitaxial growth materials. While applicable to a variety of materials, the method and material is particularly useful for growing a gallium nitride (GaN) material system epitaxial layer over a sapphire substrate. The GaN material system can include members of the Group III-V family including, but not limited to, gallium nitride (GaN), indium gallium nitride (InGaN), indium nitride (InN), aluminum gallium nitride (AlGaN), aluminum nitride (AlN), aluminum indium gallium nitride (AlInGaN), gallium arsenide nitride (GaAsN), indium gallium arsenide nitride (InGaAsN), aluminum gallium arsenide nitride (AlGaAsN), gallium phosphide nitride (GaPN), indium gallium phosphide nitride (InGaPN), aluminum gallium phosphide nitride (AlGaPN), etc. The concepts and features of the present invention are applicable to other epitaxial layer materials and substrate materials and those other compounds and materials are contemplated herein.

Furthermore, while described herein as growing an epitaxial material laterally over a dielectric, semiconducting, or conducting Bragg reflector, the method and material of the present invention can include any reflector or mirror.

In commonly assigned, co-pending U.S. Patent application entitled "EPITAXIAL MATERIAL GROWN LATERALLY WITHIN A TRENCH AND METHOD FOR PRODUCING SAME" filed on even date herewith, and assigned Ser. No. 09/062,028, (Attorney Docket No. 10980001), a material system and method for growing low dislocation density material is disclosed. The foregoing application is incorporated herein by reference.

Figure 1:
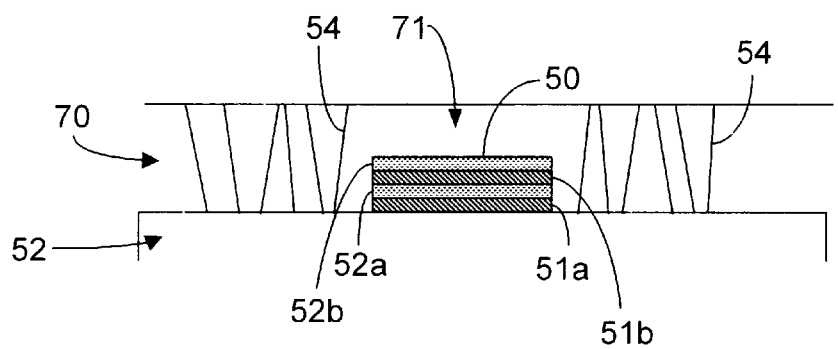
FIG. 1 is a cross-sectional schematic view illustrating a reflector buried within a laterally grown low defect density epitaxial material.

FIG. 1 shows a cross-sectional schematic view illustrating a reflector buried within a laterally grown low defect density epitaxial material. Upon substrate 52 is deposited Bragg reflector 50. Illustratively, substrate 52 is sapphire, however, substrate 52 can be other material such as but not limited to, silicon (Si), gallium arsenide (GaAs), silicon carbide (SiC), or indium phosphide (InP). Bragg reflector 50 is comprised of alternating layers of material having different refractive indices. For example, layer 51a of Bragg reflector 50 may be comprised of a first material 51a having a first refractive index $n_1$ while layer 52a may be comprised of a second material having a second refractive index of $n_2$. Suitable materials include tantalum oxide (TaO), aluminum oxide ($Al_2O_3$), titanium oxide ($TiO_2$), silicon dioxide ($SiO_2$) or silicon nitride (SiN) to make a dielectric Bragg reflector, and gallium nitride (GaN), aluminum nitride (AlN), or titanium nitride (TiN) to make a semiconductor or conducting Bragg reflector.

The difference in the refractive indices of the materials comprising the layer pair determines the reflectivity of the layer pair. The thickness of each layer 51a and 52a is $\lambda/4n$ (or odd multiples thereof), where $\lambda$ is the in vacuo wavelength of light reflected and n is the refractive index of the material. Note that any odd integer multiple of $\lambda/4n$ may be used. For example, material thickness of $3\lambda/4n$ or $5\lambda/4n$ may be used as well.

In order to increase the reflectivity of Bragg reflector 50 a number of additional layer pairs may be added. For example, layer 51b, which is comprised of the same material as layer 51a is applied over layer 52a, and similarly, layer 52b, which is comprised of the same material as layer 52a is applied over layer 51b. For simplicity, Bragg reflector 50 is depicted herein as comprising four layers of alternating refractive index material, however, Bragg reflector 50 will usually comprise additional layers of alternating refractive index material.

This arrangement allows both the placement of a reflector that forms part of a light emitting device within a epitaxial lateral growth layer, and promotes the lateral growth of low dislocation density material 71 over the reflector 50. Indeed, dislocation defects 54 are substantially reduced in region 71 over reflector 50, while dislocation defects 54 continue to exist in the region of epitaxial growth layer 70 that grows over substrate 52.

While Bragg reflector is depicted in FIG. 1 as being deposited directly over substrate 52, it can also be deposited over an epitaxial lateral growth layer, such as layer 70.

FIGS. 2A through 2H show cross-sectional schematic views collectively illustrating the growth progression of a light emitting device over the buried reflector of FIG. 1.

Figure 2A:
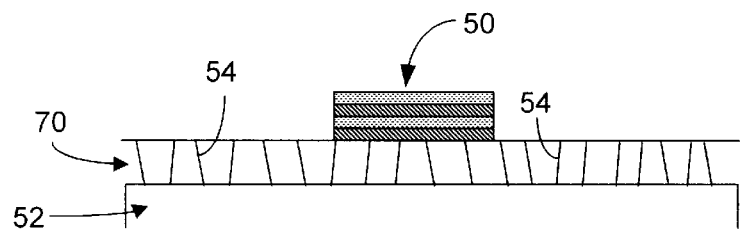
FIGS. 2A through 2H are cross-sectional schematic views collectively illustrating the growth progression of a light emitting device over the buried reflector of FIG. 1.

With reference to FIG. 2A, upon substrate layer 52 is grown first epitaxial layer 70. First epitaxial layer 70 may have a trench formed therein as disclosed in commonly assigned co-pending patent application entitled "EPITAXIAL MATERIAL GROWN LATERALLY WITHIN A TRENCH AND METHOD FOR PRODUCING SAME" filed on even date herewith, and assigned Ser. No. 09/062,028, (Attorney Docket No. 10980001). Alternatively, first epitaxial layer 70 may be planar, i.e., not having a trench formed therein.

Layer 52 can be other substrate material as known in the art, including but not limited to, silicon (Si), gallium arsenide (GaAs), silicon carbide (SiC), or indium phosphide (InP). While illustratively GaN in the preferred embodiment, first epitaxial layer 70 may be various other materials including, but not limited to, any of the GaN material system. The GaN material system can include members of the Group III-V family including, but not limited to, gallium nitride (GaN), indium gallium nitride (InGaN), indium nitride (InN), aluminum gallium nitride (AlGaN), aluminum nitride (AlN), aluminum indium gallium nitride (AlInGaN), gallium arsenide nitride (GaAsN), indium gallium arsenide nitride (InGaAsN), aluminum gallium arsenide nitride (AlGaAsN), gallium phosphide nitride (GaPN), indium gallium phosphide nitride (InGaPN), aluminum gallium phosphide nitride (AlGaPN), etc.

Figure 2B:
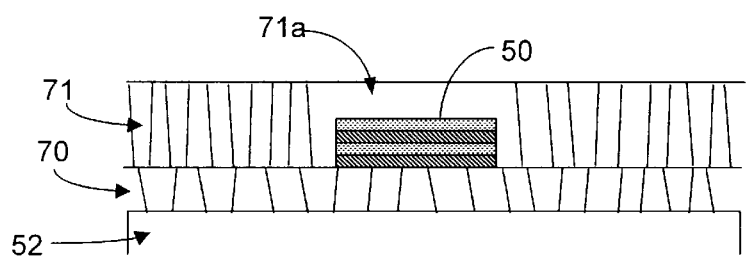

With reference now to FIG. 2B, over Bragg reflector 50 is grown a lateral epitaxial growth 71. This lateral epitaxial growth layer 71 is relatively dislocation free in the region 71a over Bragg reflector 50 and is illustratively n-type gallium nitride (GaN). Bragg reflector 50 serves as the embedded Bragg reflector for a light emitting device that can be built up from the structure we have described thus far.

Figure 2C:
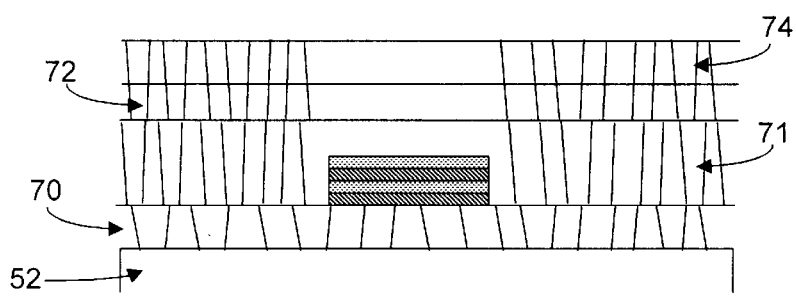

Referring now to FIG. 2C, grown over epitaxial lateral growth layer 71 is n-type aluminum gallium nitride (AlGaN) layer 72, which is followed by an additional layer of n-type gallium nitride (GaN) 74.

Figure 2D:
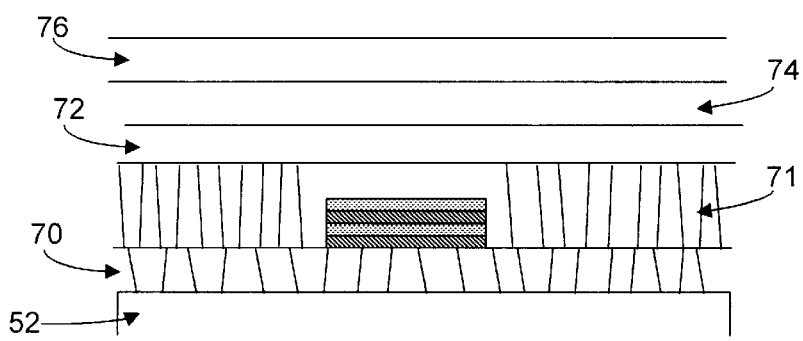

With reference now to FIG. 2D, active layer 76 is grown over n-type gallium nitride (GaN) layer 74. Active layer 76 includes multiple quantum wells (MQW) of gallium indium nitride (GaInN) of varying percentage of indium.

Figure 2E:
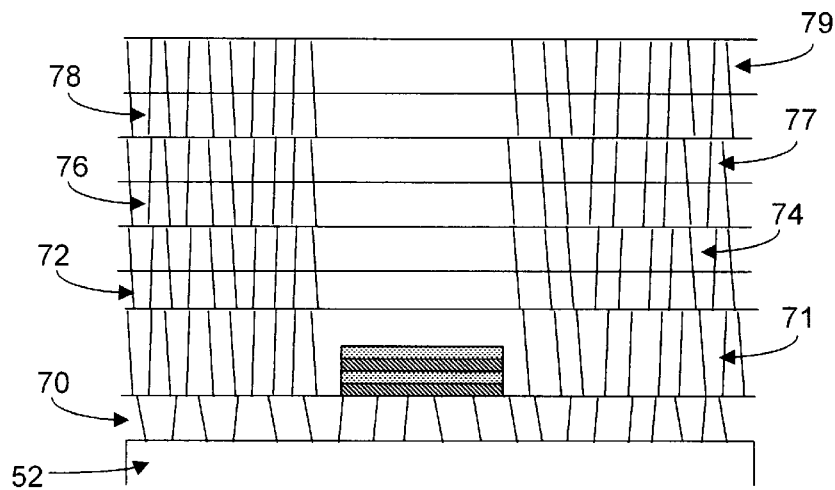

With reference to FIG. 2E, p-type gallium nitride (GaN) layer 77 is grown over active layer 76 and p-type aluminum gallium nitride (AlGaN) layer 78 is grown over GaN layer 77. These layers are symmetric to n-type layers 74 and 72 respectively. Over layer 78 is applied a final layer of p-type gallium nitride (GaN) 79.

Figure 2F:
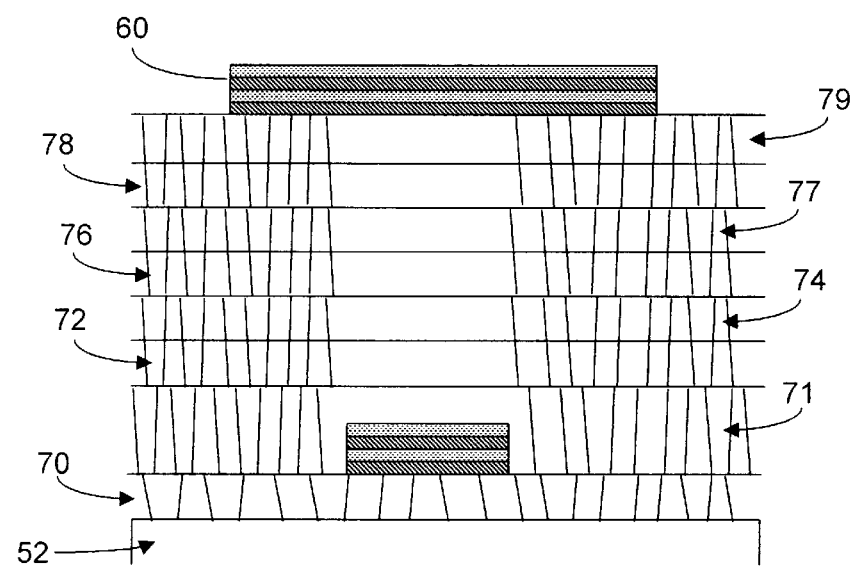

In FIG. 2F, additional Bragg reflector 60 is deposited over p-type GaN layer 79 similar to that described with respect to Bragg reflector 50 of FIG. 1.

Figure 2G:
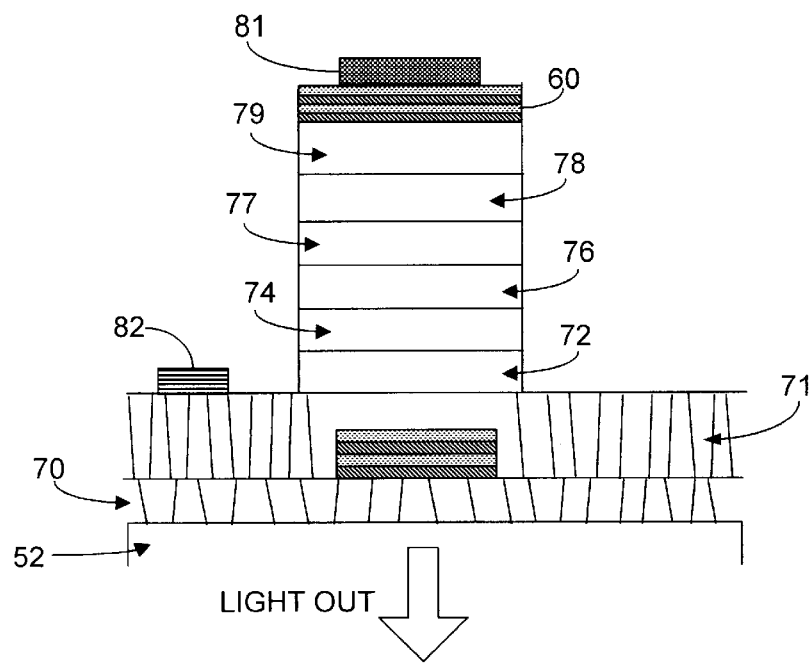

Referring to FIG. 2G, and in the case where Bragg reflector 60 is a semiconductor or conducting layer, layers 72, 74, 76, 77, 78, 79 and Bragg reflector 60 are etched to form a columnar shape. P-ohmic material 81 is applied over Bragg reflector 60 and n-ohmic material 82 is applied over epitaxial lateral growth layer 71. The arrow indicates the direction of light output from this illustrative bottom cavity surface emitting laser. By omitting Bragg reflector 60 and varying the number of layers in Bragg reflector 50 a top emitting LED can be formed.

Figure 2H:
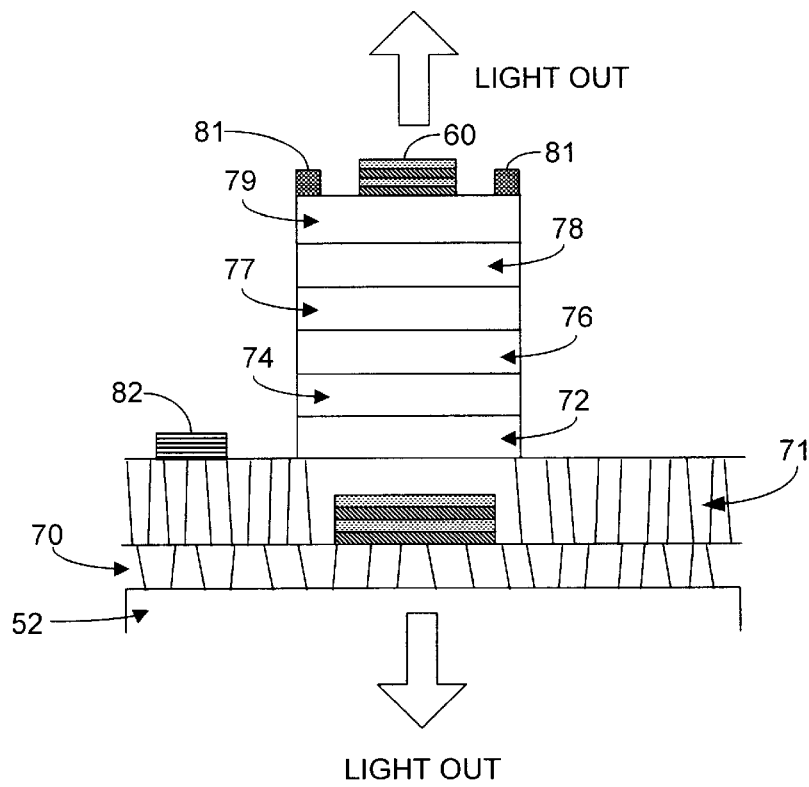

FIG. 2H shows the configuration of the device of FIG. 2G if Bragg reflector 60 comprises dielectric material. In similar fashion to FIG. 2G, layers 72, 74, 76, 77, 78, 79 and Bragg reflector 60 are etched to form a columnar shape, however a sufficient amount of Bragg reflector 60 is removed so as to allow p-ohmic material 81 to be applied over the exposed edge portion of layer 79 in a ring contact arrangement. As can be seen from the arrows, this device having a dielectric Bragg reflector emits light from both the top and the bottom.

FIGS. 3A through 3D show cross-sectional schematic views collectively illustrating a first alternative embodiment of a light emitting device over the buried reflector of FIG. 1.

Figure 3A:
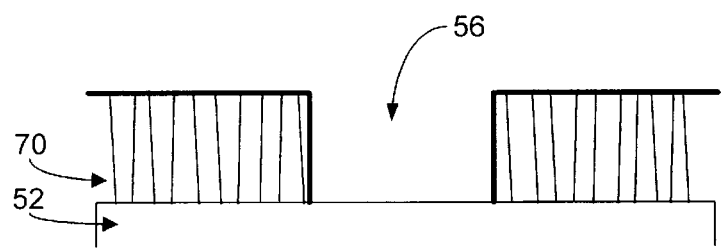
FIGS. 3A through 3D are cross-sectional schematic views collectively illustrating a first alternative embodiment of a light emitting device over the buried reflector of FIG. 1.

FIG. 3A shows that a first epitaxial layer 70 is grown over substrate 52. Illustratively, first epitaxial layer 70 is gallium nitride (GaN) and substrate 52 is sapphire. However, first epitaxial layer 70 and substrate 52 can be other material as described with respect to FIGS. 2A through 2H. Trench 56 is illustratively formed, preferably by etching as known in the art, into first epitaxial layer 70.

Figure 3B:
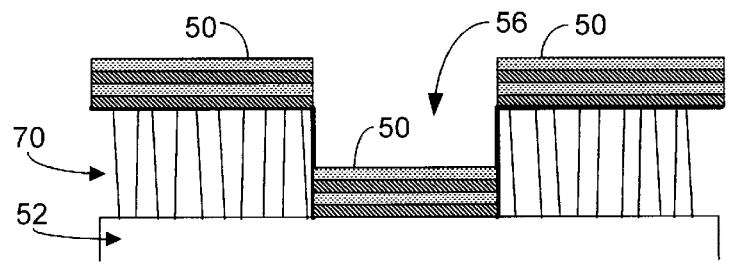

FIG. 3B shows Bragg reflector 50 deposited in the base of trench 56 in similar fashion to that described with reference to FIG. 1. Additionally, material comprising a Bragg reflector 50 is also applied over the upper surface of first epitaxial layer 70, thus forming a mask which will prevent the vertical growth of epitaxial material thereon.

Figure 3C:
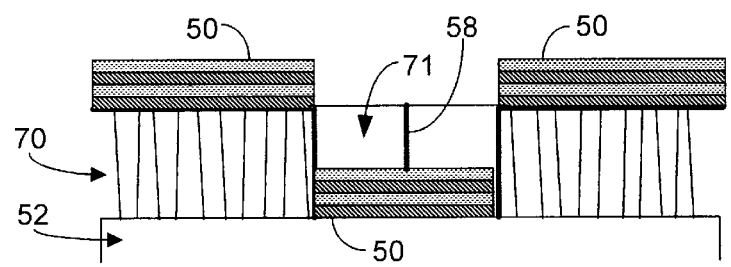

In FIG. 3C, epitaxial lateral growth layer 71 is grown from the side walls of trench 56 in accordance with the technique disclosed in commonly assigned, co-pending U.S. Patent application entitled "EPITAXIAL MATERIAL GROWN LATERALLY WITHIN A TRENCH AND METHOD FOR PRODUCING SAME" filed on even date herewith, and assigned Ser. No. 09/062,028, (Attorney Docket No. 10980001). Epitaxial lateral growth layer 71 has a reduced number of dislocation defects 54 because it has gone through a 90 degree change in growth direction, however, defect 58 exists where the growth fronts of epitaxial lateral growth layer 71 have met. In practice, devices are shifted so as to avoid being grown over defect 58, however, for simplicity, are shown herein as being grown over defect 58.

Furthermore, as disclosed in commonly assigned, co-pending U.S. Patent application entitled "EPITAXIAL MATERIAL GROWN LATERALLY WITHIN A TRENCH AND METHOD FOR PRODUCING SAME" filed on even date herewith, and assigned Ser. No. 09/062,028, (Attorney Docket No. 10980001), epitaxial lateral growth material may be grown from a single sidewall of the trench in order to eliminate defect 58.

Figure 3D:
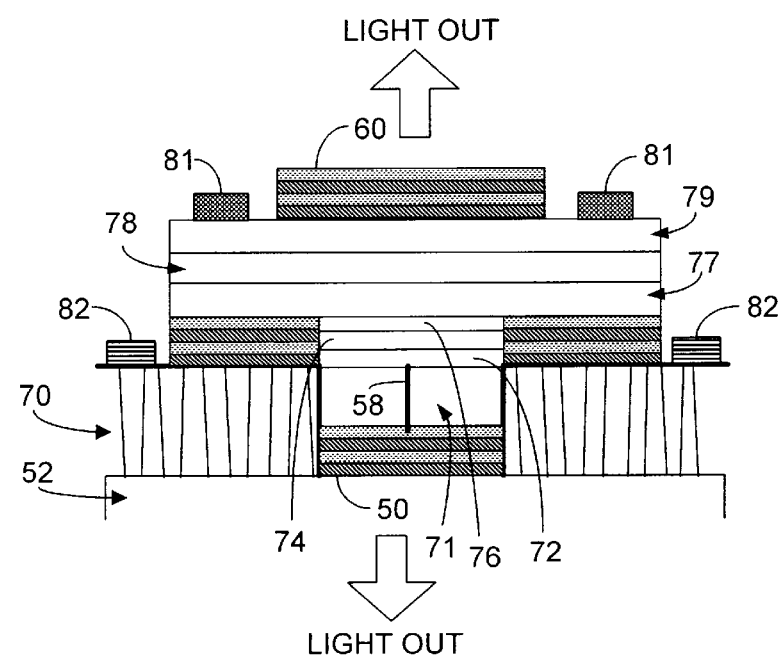

Referring now to FIG. 3D, n-type aluminum gallium nitride (AlGaN) layer 72 is applied over epitaxial lateral growth layer 71. Applied over layer 72 is n-type gallium nitride (GaN) layer 74, and applied over layer 74 is active layer 76. Active layer 76 includes multiple quantum wells (MQW) of gallium indium nitride (GaInN) of varying percentage of indium.

A layer of p-type gallium nitride (GaN) 77 is applied over active layer 76 and is followed by a p-type layer of aluminum gallium nitride (AlGaN) 78. Over layer 78 is applied a final layer of p-type gallium nitride (GaN) 79.

Still referring to FIG. 3D, Bragg reflector 60 is deposited over p-type gallium nitride (GaN) layer 79. Also applied over layer 79 are p-ohmic contacts 81. N-ohmic contacts 82 are applied over an area of first epitaxial layer 70 from which the Bragg reflector material 50 has been removed. The remaining Bragg reflector material 50 that resides on the upper surface of first epitaxial layer 70 behaves as a current confinement layer channeling the current into active layer 76. The arrows indicate the light output direction.

FIGS. 4A through 4E show cross-sectional schematic views collectively illustrating a second alternative embodiment of a light emitting device over the buried reflector of FIG. 1.

Figure 4A:
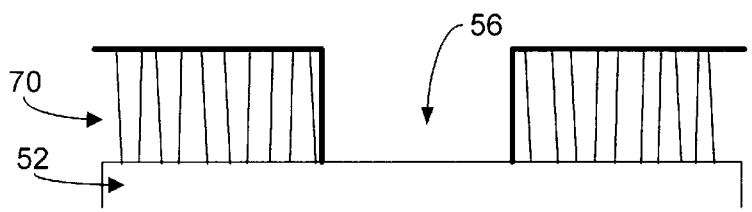
FIGS. 4A through 4E are cross-sectional schematic views collectively illustrating a second alternative embodiment of a light emitting device over the buried reflector of FIG. 1.

FIG. 4A shows substrate 52 having first epitaxial layer 70 grown thereon. First epitaxial layer 70 has trench 56 formed therein in similar fashion to that described with respect to FIG. 3A.

Figure 4B:
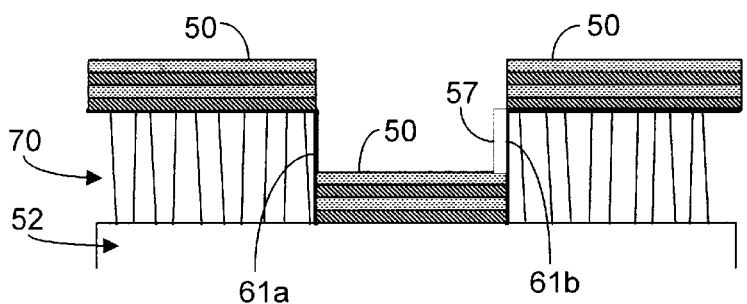

FIG. 4B shows the deposition of Bragg reflectors 50 to the base of trench 56 and to the upper surfaces of first epitaxial layer 70. Additionally, mask 57 is applied to side wall 61b of trench 56. Mask 57 is usually a dielectric material such as silicon dioxide ($SiO_2$) or silicon nitride (SiN) and can be applied to either sidewall 61a or 61b by tilting the wafer.

As disclosed in commonly assigned, co-pending U.S. Patent application entitled "EPITAXIAL MATERIAL GROWN LATERALLY WITHIN A TRENCH AND METHOD FOR PRODUCING SAME" filed on even date herewith, and assigned Ser. No. 09/062,028, (Attorney Docket No. 10980001), epitaxial lateral growth is begun from a single side wall, 61*a* in this illustration, of trench 56 so as to further reduce the occurrence of dislocation defects.

Figure 4C:
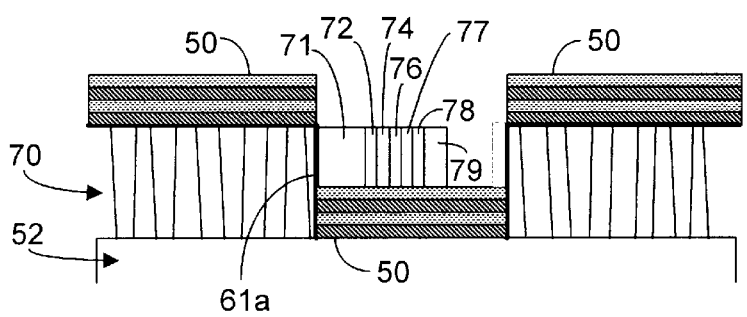

Referring now to FIG. 4C, epitaxial lateral growth layer 71 is grown from sidewall 61*a* of trench 56. Following epitaxial lateral growth layer 71 is n-type aluminum gallium nitride (AlGaN) layer 72. Applied over layer 72 is n-type gallium nitride (GaN) layer 74, and applied over layer 74 is active layer 76. Active layer 76 includes multiple quantum wells (MQW) of gallium indium nitride (GaInN) of varying percentage of indium and is oriented substantially perpendicular to the substrate 52.

A layer of p-type gallium nitride (GaN) 77 is applied over active layer 76 and is followed by a p-type layer of aluminum gallium nitride (AlGaN) 78. Over layer 78 is applied a final layer of p-type gallium nitride (GaN) 79.

Figure 4D:
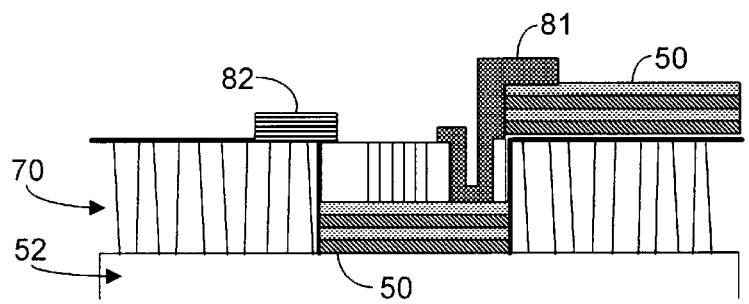

With reference to FIG. 4D, the portion of Bragg reflector 50 located on the upper surface of one side of first epitaxial layer 70 is removed. N-ohmic contact 82 is applied over a portion of n-type first epitaxial layer 70 and over a portion of epitaxial lateral growth layer 71. P-ohmic contact 81 is applied over a portion of p-type gallium nitride (GaN) layer 79, over Bragg reflector 50, over mask layer 57, and over the vertical and upper surface of Bragg reflector 50 remaining over first epitaxial layer 70.

Figure 4E:
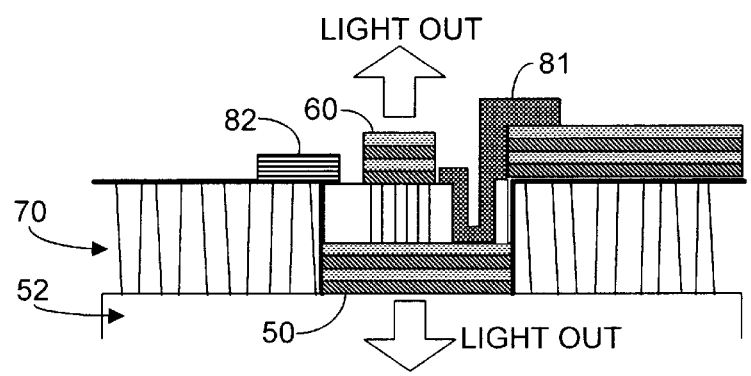

FIG. 4E shows Bragg reflector 60 applied over a portion of epitaxial lateral growth layer 71, n-type aluminum gallium nitride (AlGaN) layer 72, n-type gallium nitride (GaN) layer 74, active region 76, p-type gallium nitride (GaN) layer 77, p-type aluminum gallium nitride (AlGaN) layer 78, and a portion of p-type gallium nitride (GaN) layer 79. The arrows indicate the light output direction. In this embodiment the active region 76 extends substantially perpendicular to the surface of substrate 52.

It will be obvious to those skilled in the art that many modifications and variations may be made to the preferred embodiments of the present invention, as set forth above, without departing substantially from the principles of the present invention. For example, the present invention can be used to fabricate various light emitting devices, and is equally applicable to growing layers of other Group III-V semiconductors in general. Furthermore, either dielectric, semiconducting, or conducting reflective layers may be used. All such modifications and variations are intended to be included herein within the scope of the present invention, as defined in the claims that follow.

What is claimed is:

1. A method for forming a low defect density material having a buried reflector in a material system, comprising the steps of:

applying a first material having a first refractive index over a substrate;

applying a second material having a second refractive index over said first material; and growing an epitaxial lateral growth layer over said second material, said epitaxial lateral growth layer including an active region oriented substantially perpendicular to said substrate, said epitaxial lateral growth layer partially covering said second material.

2. The method as defined in claim 1, further including the steps of:

applying a first additional layer of said first material over said second layer; and applying a second additional layer of said second material over said first additional layer.

3. A material system, comprising:

a substrate;

a reflective layer over said substrate; and an epitaxial lateral growth layer extending over said reflective layer, said epitaxial lateral growth layer including an active region oriented substantially perpendicular to said substrate, said epitaxial lateral growth layer partially covering said reflective layer.

4. The system as defined in claim 3, wherein said reflective layer includes:

a layer of first material having a first refractive index; and a layer of second material having a second refractive index.

5. The system as defined in claim 3, wherein said epitaxial lateral growth layer has a substantially lower defect rate where it covers said reflective layer than where it covers said substrate.

6. The system as defined in claim 3, wherein said reflective layer is a Bragg reflector.

7. The system as defined in claim 3, wherein said reflective layer is a dielectric material.

8. The system as defined in claim 3, wherein said reflective layer is a semi-conductor material.

\* \* \* \* \*